United States Patent [19]
Paterson

[11] Patent Number: 4,763,177
[45] Date of Patent: Aug. 9, 1988

[54] READ ONLY MEMORY WITH IMPROVED CHANNEL LENGTH ISOLATION AND METHOD OF FORMING

[75] Inventor: James L. Paterson, Richardson, Tex.

[73] Assignee: Texas Instruments Incorporated, Dallas, Tex.

[21] Appl. No.: 54,113

[22] Filed: May 20, 1987

Related U.S. Application Data

[63] Continuation of Ser. No. 702,562, Feb. 19, 1985, abandoned.

[51] Int. Cl.⁴ .......................................... H01L 29/78
[52] U.S. Cl. .................................... 357/23.5; 357/55; 365/185
[58] Field of Search .................... 357/23.5, 55, 54 M; 365/185

[56] References Cited

U.S. PATENT DOCUMENTS

| | | | |
|---|---|---|---|
| 3,984,822 | 10/1976 | Simko et al. | 357/54 |
| 4,101,344 | 7/1978 | Kooi et al. | 357/41 |
| 4,112,509 | 9/1978 | Wall | 365/185 |
| 4,122,544 | 10/1978 | McElroy | 365/185 |
| 4,151,021 | 4/1979 | McElroy | 357/45 |
| 4,199,772 | 4/1980 | Natori | 357/55 |
| 4,222,062 | 9/1980 | Trotter et al. | 357/45 |
| 4,222,063 | 9/1980 | Rodgers | 357/55 |
| 4,243,997 | 1/1981 | Natori | 357/55 |
| 4,364,074 | 12/1982 | Garnache | 357/23.5 |
| 4,541,001 | 9/1985 | Schutten | 357/55 |
| 4,593,454 | 6/1986 | Baudrant | 357/67 S |

FOREIGN PATENT DOCUMENTS

| | | | |
|---|---|---|---|
| 3323433A | 2/1984 | Fed. Rep. of Germany | 357/23.5 |
| 52-63074A | 5/1977 | Japan | 357/55 |
| 53-118981A | 10/1978 | Japan | 357/55 |
| 53-125778A | 11/1978 | Japan | 357/41 |
| 56-126973 | 3/1980 | Japan | 357/55 |
| 58-220464A | 12/1983 | Japan | 357/23.5 |
| 59-61188 | 4/1984 | Japan | 357/23.5 |
| 59-78576 | 5/1984 | Japan | 357/23.5 |
| 59-154071 | 9/1984 | Japan | 357/23.5 |

Primary Examiner—Andrew J. James
Assistant Examiner—Mark Prenty
Attorney, Agent, or Firm—Rodney M. Anderson; Leo N. Heiting; Melvin Sharp

[57] ABSTRACT

A non-volatile memory wherein the channel of the floating gate memory devices is recessed.

13 Claims, 6 Drawing Sheets

READ ONLY MEMORY WITH IMPROVED CHANNEL LENGTH ISOLATION AND METHOD OF FORMING

This is a continuation of application Ser. No. 702,562, filed 2/19/85 and now abandoned.

TECHNICAL FIELD OF THE INVENTION

This invention relates to semiconductor devices, and more particularly relates to non-volatile memory devices with improved channel length control.

BACKGROUND OF THE INVENTION

Non-volatile semiconductor memory devices are advantageous in that the information stored therein is not lost when the power supply is removed. A description of a typical non-volatile MOS ROM wherein the stored information is permanently fixed upon manufacture by the gate level mask or moat mask is described in U.S. Pat. No. 3,541,543, assigned to the present assignee. In addition, various electrically programmable ROM (EPROM) devices have heretofore been developed such as described in U.S. Pat. No. 3,984,822, which employs a floating gate in a double level polysilicon MOS ROM. In this device, a floating gate is provided which may be charged by injection of electrons from the channel and the device stays charged for years. Electrically alterable ROMs (EEPROMs) have also been developed which use floating gate cells with dual injection (both holes and electrons) so that the gates may be charged or discharged, such as described in U.S. Pat. Nos. 3,881,180 and 3,882,469, assigned to the present assignee.

Floating gate MOS memory cells have been heretofore developed which are fabricated by an n channel, silicon-gate, self-aligned, double level polysilicon process which is compatible with standard processing techniques. In these processes, implants of buried n+ material are patterned and selective oxidation is used to grow a thin oxide layer over the channel areas and a relatively thick oxide over the n+ diffusion areas. This process and the resulting memory device is described in U.S. Pat. No. 4,151,021, assigned to the present assignee.

While such prior memory devices have worked well in practice, the prior devices have resulted in relatively deep effective n+ junctions and have not thus been completely satisfactory with respect to punch-through characteristics. A need has thus arisen for a read only memory device with shallower effective junctions but with effective channel isolation. Moreover, previously developed non-volatile memory devices have had reduced effective electrical channel lengths due to lateral migration of the differentially grown oxide. It is thus desirable to develop non-volatile memories with increased effective electrical channel length. Further, in previously developed non-volatile devices, the sheet resistance of the formed column lines has often been excessively high, and a need has arisen for a technique for fabricating non-volatile memories to enable reduction of the sheet resistance of the column lines.

SUMMARY OF THE INVENTION

In accordance with the present invention, a memory device and method for fabricating is provided which substantially eliminates or reduces the problems heretofore associated with prior read only memory devices.

In accordance with a specific aspect of the invention, a semiconductor memory is formed by introducing a dopant impurity into the face of a semiconductor body. A layer of insulating material is formed over the doped layer. A trench is formed to extend through the isolation layer and the doped layer into the semiconductor body. A gate insulating layer is formed over the insulating layer and covers the trench. A layer of conductive material is then formed over the trench to form a floating gate. The trench thus provides an effective junction depth substantially less than previously developed junction depths utilizing differential oxidation.

In accordance with another aspect of the invention, a floating gate semiconductor memory is formed in an array of rows and columns of memory cells. Spaced apart elongated trenches are formed to extend through oxide and first-conductivity-type layers into a second-conductivity-type semiconductor body to form columns of diffusions. A gate gate insulating layer is formed over the oxide layer and covers the trenches. Discrete regions of polycrystalline silicon are formed to overlie spaced apart locations of the trenches to form floating gates. Another insulating layer is formed over the floating gates. A pattern of spaced apart parallel strips of polycrystalline silicon are formed overlying the floating gates and normal to the columns to form control gates which are connected to form rows of memory cells.

In another aspect of the invention, a refractory metal silicide is formed on the diffusion prior to the formation of oxide, in order to lower the effective sheet resistance of the device. If desired, the discrete regions of polycrystalline silicon (which form floating gates) may be planarized to fill only the trenches.

BRIEF DESCRIPTION OF THE DRAWINGS

For a more complete understanding of the present invention and for other objects and advantages thereof, reference is now made to the following description, taken in conjunction with the accompanying drawings, in which.

DETAILED DESCRIPTION OF THE INVENTION

Figure 1:
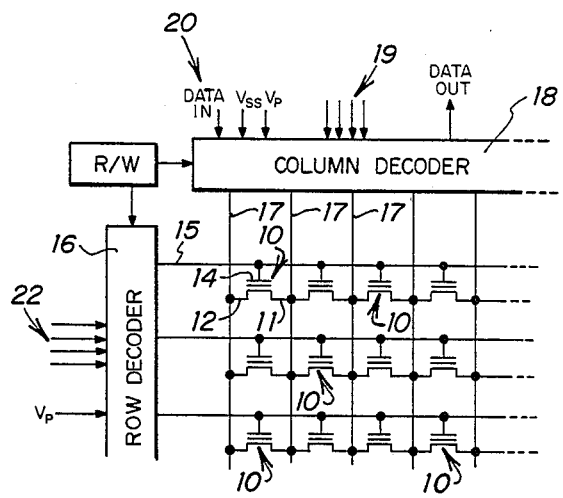
FIG. 1 is an electrical schematic diagram of an array of memory cells according to an embodiment of the invention.

FIG. 1 illustrates an array of memory cells formed in accordance with the present invention. Each cell includes a floating gate transistor generally identified by numeral 10 having a source electrode 11 and a drain electrode 12. Each transistor 10 further includes an insulated floating gate and a control gate 14 which is continuous with a row address line 15. All of the row address lines 15 are connected to a row decoder 16. The source and drain electrodes 11 and 12 of each transistor 10 are provided by column lines 17. The source and drain column lines 17 are each connected at the end thereof to a column decoder 18.

As is known, in write (program) mode, column decoder 18 functions to apply either a high voltage or a low voltage selectively to each source and drain column line 17, in response to a column address on lines 19 and a "zero" or "one" data input 20. For write operations, the row decoder 16 applies a high voltage, a low voltage or ground to each of the row lines 15 in response to a row address on lines 22. For a read operation, the column decoder 18 grounds the lines 17 to the right of the selected cell and connects a static load to the column line 17 on the left, using a decode arrangement as described in U.S. Pat. No. 3,988,604, assigned to the present Assignee. Also for a read operation, the row decoder 16 applies a logic "one" to the selected row line 15 and applies a logic "zero" to all other row lines.

Figure 2:
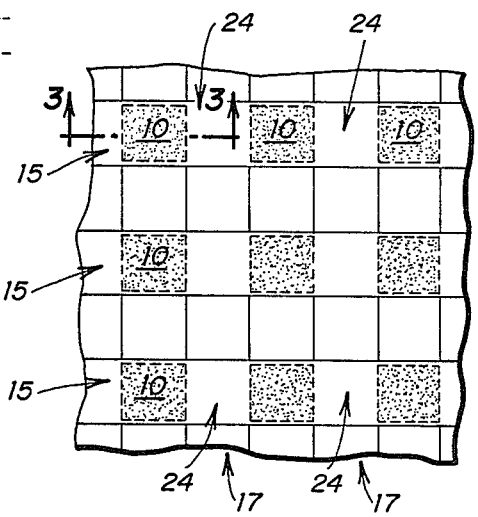
FIG. 2 is a plan view of a portion of a semiconductor integrated circuit chip containing an array of the devices shown in FIG. 1.

FIG. 2 is a plan view of an enlarged portion of the memory cells shown in the array of FIG. 1. The area illustrated in FIG. 2 may be approximately 0.6 mil×1.0 mils in size. It will be understood that the entire cell array will contain a large number of cells, such as, for example, 65536 cells ($2^{16}$) or greater. FIG. 2 illustrates a group of transistors 10 which are created in three elongated areas forming the rows of cells each interconnected by a row line 15. The column lines 17 of the cells are formed by n+ diffused regions 24 which also form the sources and drains of the transistors, as will be subsequently described. Elongated parallel strips of polycrystalline silicon form the row address lines 15 and the control gates of the transistors, as will be subsequently described. The floating gates are buried beneath the control gates (row address lines) 15.

The present invention will be described with respect to the construction and fabrication of an EPROM device. However, it will be understood that the present technique is also useful for the fabrication of an EEPROM or even a ROM or PROM device, with suitable alterations as is known to those skilled in the art.

Figure 3:
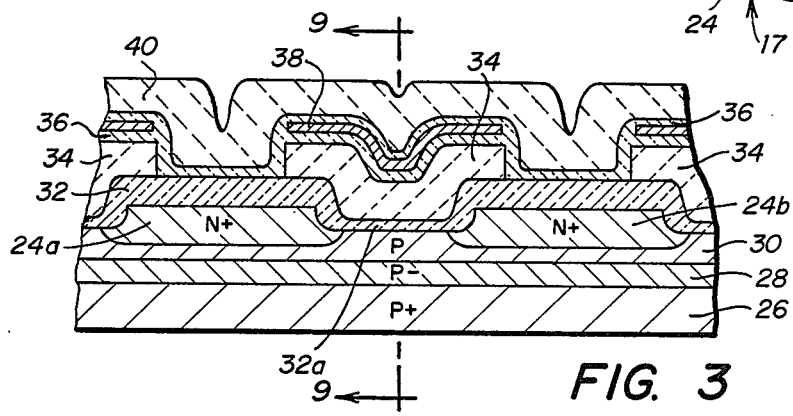
FIG. 3 is an elevational view in section of one of the memory cells of FIG. 2 taken along section lines 3—3 of FIG. 2.

FIG. 3 illustrates a cross-section of a memory cell formed in accordance with the invention. The cell includes a p+ substrate 26 with a p− epilayer 28. A p well 30 is formed over the p− epilayer 28. Two n+ diffused regions 24a and b are spaced apart by a trench. An oxide layer 32 covers regions 24a-b. The trench is filled with an oxide layer 32a and a polycrystalline silicon layer 34. Oxide layer 32 is greater in thickness over the n+ diffused regions 24a-b than the thickness of oxide layer 32a over the trench separating the regions 24a-b. A second layer of oxide 36 isolates the polycrystalline region 34 and includes therein a region 38 of $Si_3N_4$. The $Si_3N_4$ region 38 is covered on all sides by the oxide layer 36. A polycrystalline silicon layer 40 covers the upper surfaces of the oxide layer 36.

The active portion of the cell shown in FIG. 3 is created by the channel region between the n+ regions 24a-b. N+ regions 24a-b form the source and drains of the transistor. A floating gate is formed by the polycrystalline silicon region 34.

As is known, the cell may be programmed by holding the drain at a high voltage and the source at $V_{ss}$ while the control gate is at $V_p$. Thus, the level of current through the channel between n+ regions 24a-b is such that electrons are injected through the oxide layer 32 to charge the floating gate formed by the polycrystalline silicon region 34. Once charged, the floating gate stays in this condition for a long period of time, and during this time the apparent threshold voltage of the transistor is greatly increased. The array may be deprogrammed (erased) by exposing to ultraviolet light. Although the present invention will be illustrated with the construction of an EPROM, it will be understood that the invention also encompasses the formation of EEPROMs, or ROMs or PROMs.

Figure 4:
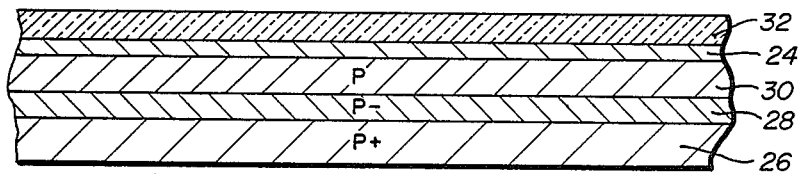
FIG. 4 is a sectional view illustrating an initial stage of manufacture of the device shown in FIG. 3.

FIG. 4 illustrates a sectional view of the initial steps of fabrication of the device shown in FIG. 3. The p+ doped silicon substrate 26 may be comprised of, for example, $10^{18}/cm^3$ boron while the p− doped epitaxial silicon layer 28 may be formed of $10^{15}/cm^3$ boron. P− epilayer 28 may be formed to a thickness of 10 microns. Layer 30 is formed by implantation of $10^{12}/cm^3$ boron which is driven for 1500 minutes at 1100° C. to form a 3 micron deep p well 30. Arsenic ions are then implanted at 50 KEV, $5E15/cm^2$. The implanted arsenic region is then annealed at 900° C. for 100 minutes to form the n+ impurity layer 24. The layer of oxide 32 is then deposited (or thermally grown) to a depth of 1000 Å, for example, by low pressure chemical vapor deposition (LPCVD) at 800° C.

Figure 5:
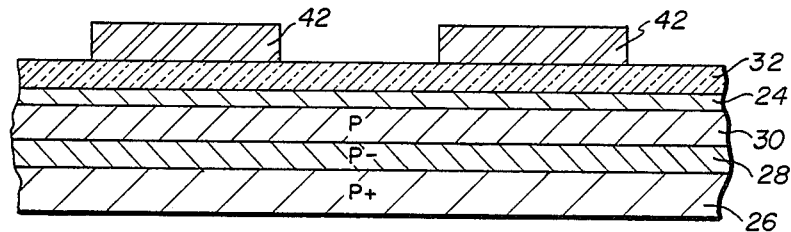
FIGS. 5-8 illustrate successive steps in the fabrication of the device shown in FIG. 3.

Referring to FIG. 5, resist areas 42 are next patterned over the oxide layer 32 and the oxide is etched utilizing conventional techniques. For example, a plasma etch or reactive ion etch may be performed.

Figure 6:
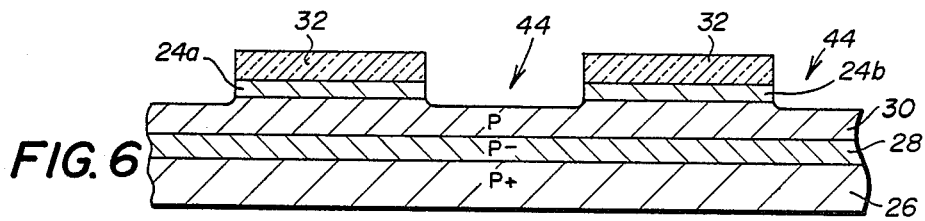

As shown in FIG. 6, the etching procedure forms spaced apart trenches (recesses) generally designated by the numerals 44. The trenches 44 extend through the oxide layer 32 and the n+ layer 24 slightly into the p well 30. The trenches 44 thus serve to separate the n+ diffused layers 24a and 24b. The n+ regions 24a-b thus form column lines as shown in FIG. 1.

The resulting structure shown in FIG. 6 will result in n+ regions 24a-b having a thickness of approximately 500 Å (before high-temperature processing), and with oxide layer 32 having a thickness of approximately 1000

Å. The depth of the trenches 44 may be, for example, 2000 Å.

Figure 7:
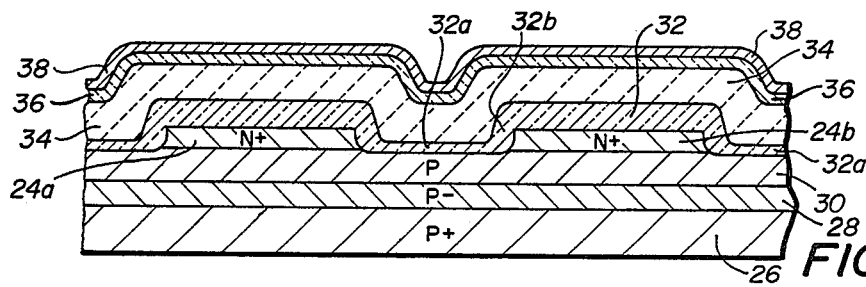

FIG. 7 illustrates subsequent steps in the fabrication of the present device. A sacrificial or "dummy" oxide layer, not shown, is grown over the upper portion of the device shown in FIG. 6. Boron is then implanted to set the threshold voltage of the transistor. The implanted boron will typically be $5 \times 10^{11}$ boron ions/cm$^2$. The sacrificial oxide is then stripped and a gate oxide is grown to form the layer 32a and 32b shown in FIG. 7. It will be noted that the thickness of layer 32a is reduced in the bottom of the trench 44 from the thickness of layer 32b along the edges of the n+ regions 24a-b. This differential thickness is provided by differential oxidation. The gate oxide at the bottom of the trench 44 has a thickness of approximately 300 Å at 850° C. in oxygen and 5% HCl.

As further shown in FIG. 7, a polycrystalline silicon layer 34 is then deposited, for example, at 620° C. by LPCVD. The polysilicon layer is then doped at 950° C. approximately 15 minutes with oxygen, nitrogen and POCl$_3$. Thereafter, a 250 Å thickness of LPCVD oxide layer 36 is then deposited at 800° C. Subsequently, a layer 38 of LPCVD nitride is deposited at 800° C. to a thickness of approximately 250 Å.

Figure 8:
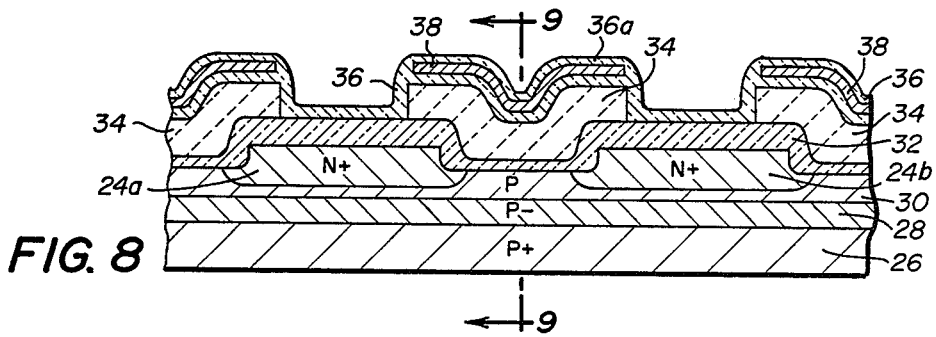

Suitable resist patterns, not shown, are applied over the desired floating gate region and an etch is provided through the nitride layer 38, oxide layer 36 and polycrystalline silicon layer 34 to form the floating gate polycrystalline silicon region 34 shown in FIG. 8. As may be seen, region 34 fills the trench 44 and overlies the edges of n+ regions 24a-b. The etch bares the sides of the polycrystalline silicon regions 34 and nitride layer 38. Thus, to isolate the edges of region 34, a steam oxide layer 36a is grown. It will be seen that because of the thermal cycles employed in the fabrication, the depths of the n+ regions 24a-b substantially increase. However, with the use of the trenches 44, the effective depth of the n+ regions 24a-b remains relatively small. The resulting oxide layer 36 thickness over the sides of the polycrystalline silicon region 34 and over regions 24a-b will be approximately 500 Å, while the thickness of the oxide layer 36a over the top of the nitride layer 38 will be approximately 40-50 Å.

FIG. 8 thus shows the device of FIG. 3 before the application of the second polycrystalline silicon layer 40 shown in FIG. 3. Polycrystalline silicon layer 40 is deposited by LPCVD at 620° C. to form a thickness of approximately 4000 Å. The polycrystalline silicon layer 40 is then doped at 950° C. with oxygen, nitrogen and POCl$_3$ for approximately 15 minutes.

Figure 9:
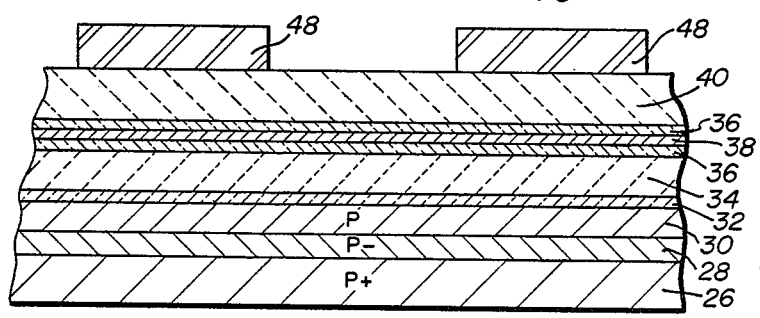
FIG. 9 is a sectional view taken along section line 9—9 in FIG. 8 illustrating the application of resists in fabrication of the device.

FIG. 9 illustrates the second polycrystalline silicon layer 40 taken generally along the section lines 9—9 of FIG. 3. Photo-resist patterns 48 are formed over the second polycrystalline silicon layer 40 to define the row lines 15. The structure shown in FIG. 9 is then etched to self-align the polycrystalline silicon layer 40 and the polycrystalline silicone layer 34. The etch process etches through the polycrystalline silicon layer 40, the oxide layer 36, the nitride layer 38, the oxide layer 36 and the polycrystalline silicon layer 34.

Figure 10:
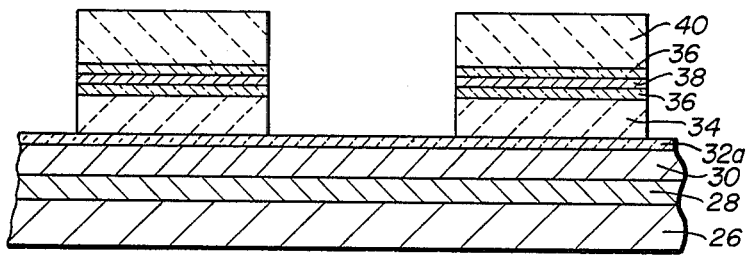
FIG. 10 is a sectional view of the device shown in FIG. 9 after an etching step has been provided.

FIG. 10 illustrates the resultant structure of FIG. 9 after the etching to form the row lines 15 previously shown in FIG. 2.

Figure 12:
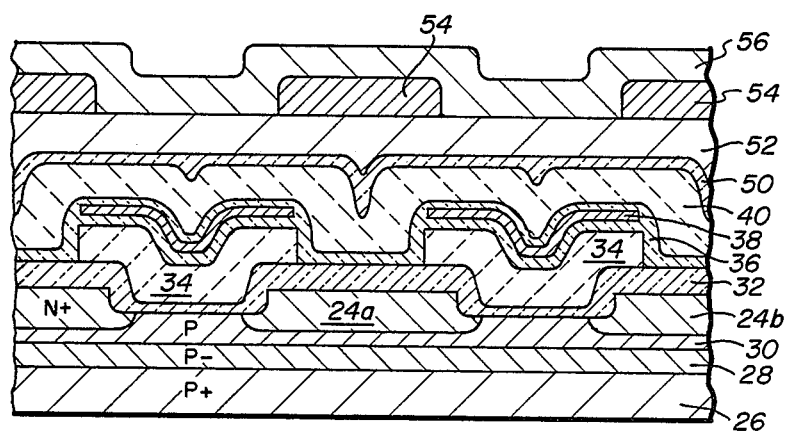
FIG. 12 is a sectional view taken along section lines 12—12 of FIG. 11.

FIG. 12 illustrates a sectional view similar to that shown in FIG. 8 after the addition of subsequent layers. An undoped pad oxide layer 50 is deposited and is covered with a layer 52 of phosphorous-doped silicon oxide. Metal contact layers 54 such as aluminum or the like are then formed and subsequently patterned to form column lines. (That is, in this sample embodiment, each diffusion 24 will be periodically contacted by a metal line 54, which shunts it to lower its overall resistance.) The metal layers 54 are then covered with protective oxide coating 56 formed of 4% phosphorous-doped silicon oxide.

Figure 11:
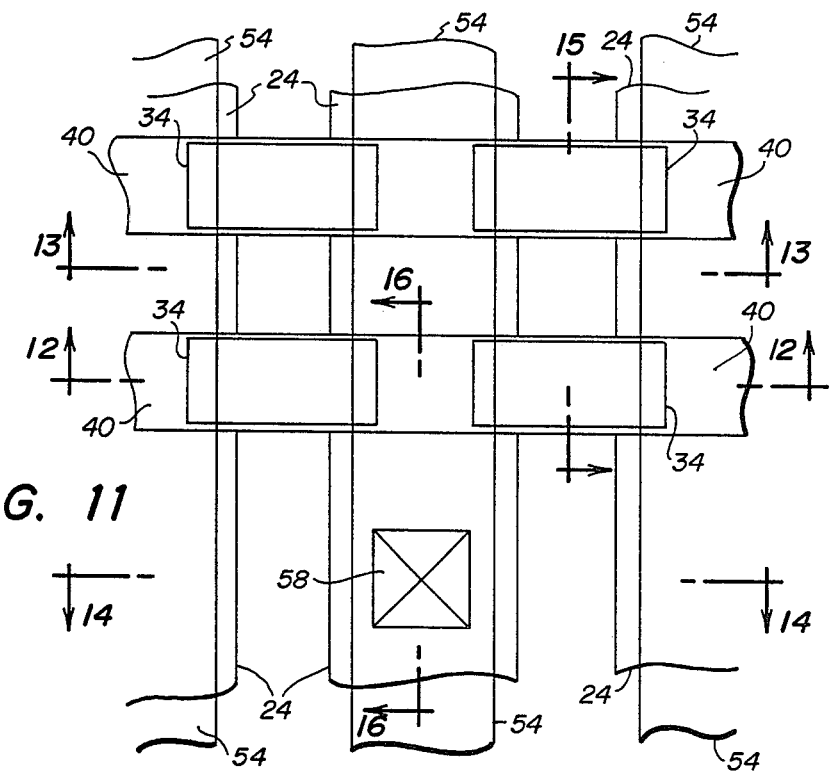
FIG. 11 is a plan view of the completed device of FIG. 3.

FIG. 11 is a plan view of the device of FIG. 12 illustrating the overlapping of the polycrystalline silicon regions 34 of the oxide layer 32. FIG. 11 also shows the patterned second polycrystalline silicon layers 40 which form the row lines 15. As previously noted, the n+ regions 24 extend under the metal leads 54 along the column lines 17. Metal contacts 58, to be subsequently shown, are formed to provide contact between the metal lead 54 and the n+ diffused regions 24. FIG. 12 is taken along section lines 12—12 of FIG. 11.

Figure 13:
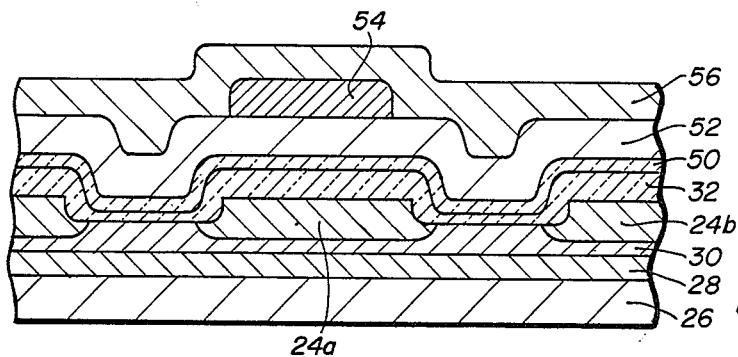
FIG. 13 is a sectional view taken generally along section lines 13—13 of FIG. 11.

FIG. 13 is a sectional view of the present device taken generally along the section lines 13—13 of FIG. 11. FIG. 13 illustrates the elimination by etching of the first and second polycrystalline silicon layers 34 and 40 in this location.

Figure 14:
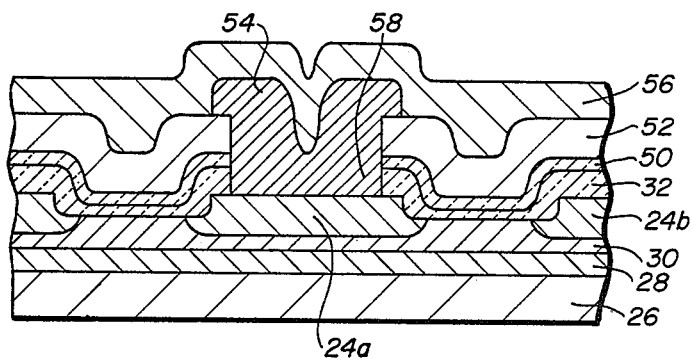
FIG. 14 is a sectional view taken generally along the section lines 14—14 of FIG. 11.

FIG. 14 is a sectional view taken generally along section lines 14—14 in FIG. 11 and illustrates the formation of the metal contact 58. As previously noted, in order to provide contact between the metal layer 54 and the n+ diffused region 24a, an etch is provided in a rectangular area shown in FIG. 11 through the silicon oxide layer 52, pad oxide layer 50 and oxide layer 32. Metalization is then formed to extend from the level of the metal layer 54 to contact the n+ diffused region 24a to form the metal contact 58.

Figure 15:
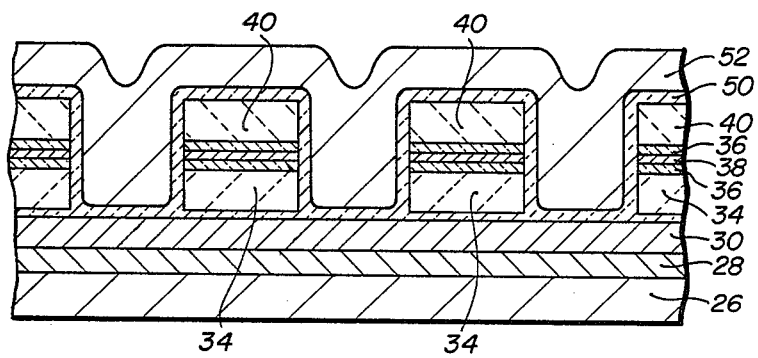
FIG. 15 is a sectional view taken generally along the section lines 15—15 of FIG. 11.

FIG. 15 illustrates a sectional view taken generally along the section lines 15—15 in FIG. 11. FIG. 15 is similar to FIG. 10, with the addition of the pad oxide layer 50 and the phosphorous-doped silicon oxide layer 52.

Figure 16:
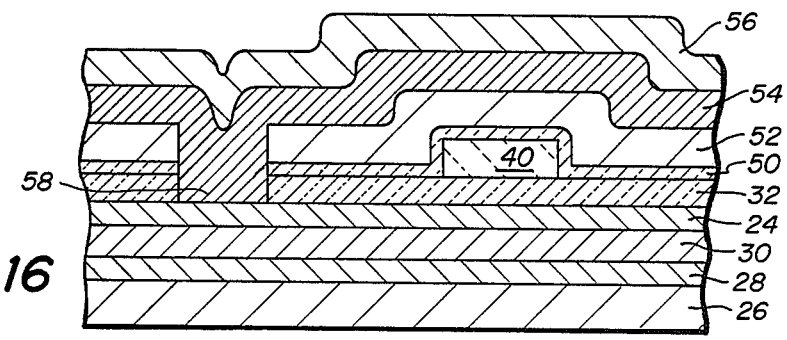
FIG. 16 is a sectional view taken generally along the section lines 16—16 of FIG. 11.

FIG. 16 is a sectional view taken generally along the section lines 16—16 of FIG. 11. FIG. 16 illustrates the width of the second polycrystalline silicon layer 40 and also again illustrates the connection of metal lead 54 by contact 58 with n+ diffused layer 24.

Figure 17:
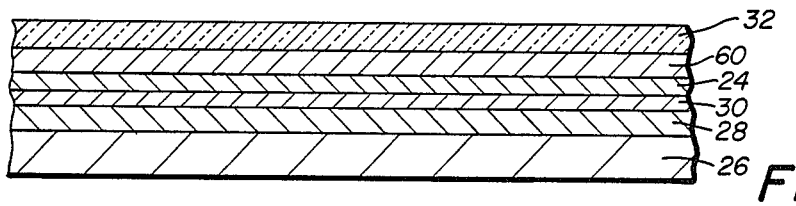
FIG. 17 is a sectional view illustrating the initial steps of fabrication of a second embodiment of the present invention utilizing a refractory metal silicide.
Figure 18:
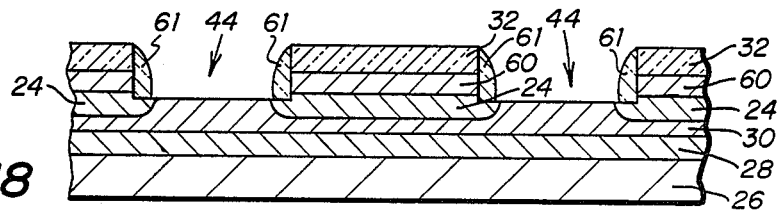
FIGS. 18 and 19 illustrate successive steps in the fabrication of the second embodiment of the invention utilizing silicide.
Figure 19:
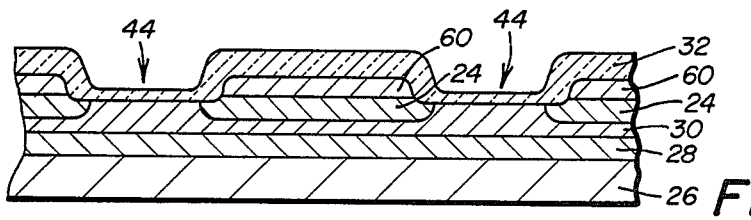

FIGS. 17-19 illustrate a second embodiment of the present invention wherein a refractory metal silicide on the buried diffusion is used to effectively lower the sheet resistance of the device. As shown in FIG. 17, the initial steps of fabrication utilize the same p+ substrate 26, p− epitaxial layer 28 and p well layer 30 as described with respect to FIG. 4. Similarly, a layer 24 of n+ doped material is formed as previously described. However, in this embodiment, a layer of refractory metal silicide is formed by initially depositing, by sputtering or the like, a layer 60 of titanium. TiSi$_2$ is then formed by subjecting the device to 600°-700° C. The resulting TiSi$_2$ is annealed at temperatures from 800°-900° C. A layer 32 of LPCVD oxide is then deposited at 800° C. to a depth of approximately 1,000 Å. Instead of titanium, other refractory metals such as molybdenum or tantalum may be utilized. The resulting thickness of refractory metal layer 60 will be approximately 1,000 Å, while the resulting thickness of the n+ conductivity layer 24 will be approximately 500 Å.

FIG. 18 shows the subsequent step in the formation of the second embodiment of the invention. In a similar manner to that shown in FIG. 5, areas of resist are deposited over the oxide layer 32 and a plasma or reactive ion etch is provided to form the trenches 44 as previously shown in FIG. 6. As may be seen, the difference between the second embodiment of the device shown in FIG. 18 and the first embodiment of the device shown in FIG. 6 is the addition of the silicide layer 60. As noted, with the present invention, differential oxidation is not required and only a uniform layer of oxide 32 is required. The isolation of the n+ regions 24 is provided by the trenches 44, as previously described.

A layer of LPCVD TEOS-based oxide, not shown, is deposited to a thickness of 2500 Å. The oxide is etched back to leave sidewall oxide filaments 61 on the sides of the trenches 44 (FIG. 18). As previously described with respect to FIGS. 6 and 7, a sacrificial oxide is then grown to remove silicon damaged during the etching of the silicon and the TEOS oxide. Boron is then implanted to set the threshold voltage of the transistor. Typically, boron of $5 \times 10^{11}$ boron ions/cm$^2$ is utilized. The sacrificial oxide is then stripped and gate oxide 32 is grown over the bottom of the trenches 44, as shown in FIG. 19. Approximately 300 Å thickness of oxide 32 is grown using such as 850° C. in O$_2$ plus 5% HCl.

The process described with respect to FIGS. 7–10, including depositing the polycrystalline silicon layer 34, is then repeated to finish the second embodiment of the invention. The resulting device will be similar to that shown in FIG. 3, with the addition of the silicide layer 60 between the n+ regions 24 and the oxide layer 32. This silicide layer 60 enables lowering of the sheet resistance of the device from as high as 25 ohms/square to below 2 ohms/square.

Figure 20:
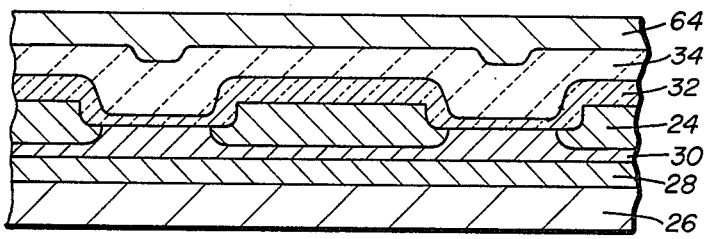
FIG. 20 illustrates the initial steps of fabrication of a third embodiment of the present invention utilizing a planarizing of the polysilicon layer of the invention.

FIG. 20 illustrates fabrication of the third embodiment of the invention. In this embodiment, the layers 24–32 have been formed identically to the process previously described and as shown in FIGS. 4–7. In this embodiment of the invention, however, after the polycrystalline silicon layer 34 is deposited and doped, a photo-resist layer 64 is applied. An etch is performed on the device which etches the resist layer 64 and the polycrystalline silicon layer 34 at the same rate. The etch is continued until the planarized structure appears as shown in FIG. 21.

Figure 21:
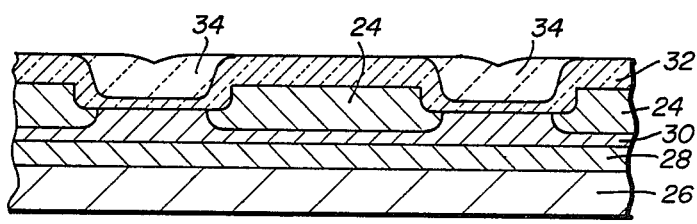
FIGS. 21-23 illustrate subsequent steps in the fabrication of the third embodiment of the present invention utilizing planarizing techniques.

It may be seen in FIG. 21 that polycrystalline silicon 34 is left only within the trenches 44 and no polycrystalline silicon overlies the oxide layer 32 directly above the n+ regions 24. In this aspect of the invention, the original thickness of the polycrystalline silicon layer 34 is chosen such that the thickness is greater than one-half the width of the trenches 44.

Figure 22:
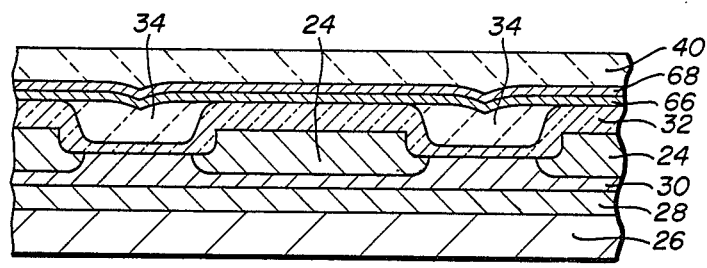

Referring to FIG. 22, 250 Å thickness of LPCVD oxide is deposited at 800° C. to form the oxide layer 66. A 250 Å thickness of LPCVD nitride is then formed at 800° C. to form the nitride layer 68. The second polycrystalline silicon layer 40, previously noted, is then formed and doped in the previously described manner. The planarized embodiment of the invention is then completed in the manner previously described to form the device shown in FIG. 23 which generally corresponds to the first embodiment shown in FIG. 2. In this embodiment, an oxide layer may or may not be formed between the nitride layer 68 and the second polycrystalline silicon layer 40, as was the case in the embodiment shown in FIG. 12.

Figure 23:
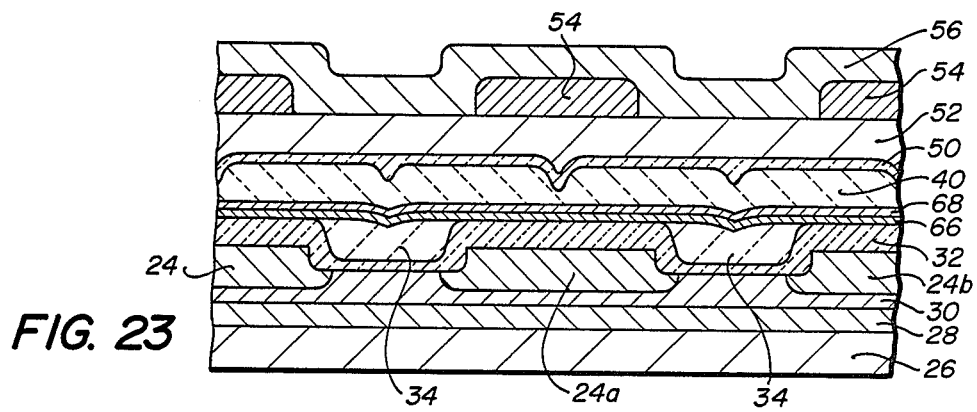
Figure 24:
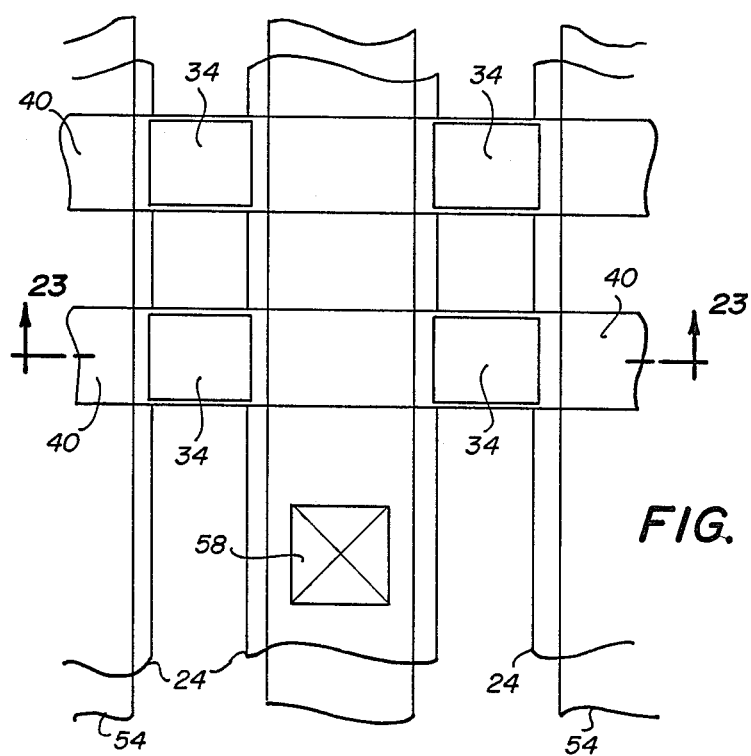
FIG. 24 is a plan view of the resultant third embodiment of the invention utilizing planarizing of the polysilicon layer.

FIG. 24 illustrates a plan view of the planarized polycrystalline silicon layer device shown in FIG. 23, the FIG. 23 being taken generally along the section lines 23—23 of FIG. 24. As shown in FIG. 24, the device thus formed corresponds generally with that shown in FIG. 11, with the exception that the polycrystalline silicon regions 34 do not overlap the n+ regions 24.

It will thus be seen that the present invention provides substantial advantages over previously developed floating gate devices. In prior devices, the effective gate length, or the distance between adjacent n+ regions 24, commonly termed the "electrical channel length", was limited because of lateral oxide growth and outdiffusion of dopants during oxidation of the field oxide layer. In the present invention, with use of the trenches 44, the effective gate length or channel length remains the width defined by the channels 44.

Previously developed devices also commonly had effective junction depths of the n+ regions of greater than 0.5 microns, thereby sometimes causing punchthrough. With the present invention, the effective junction depth, as measured at the edges of the n+ regions 24, is substantially reduced to as low as 0.2 microns, thereby substantially reducing possibilities of punchthrough.

Moreover, the use of the silicide layer of the invention tends to substantially reduce the effective sheet resistance of the device. With the use of the planarized embodiment of the invention, the creation of polycrystalline silicon filaments between control lines is substantially eliminated.

Although the preferred embodiment has been described in detail, it should be understood that various changes, substitutions and alterations can be made therein without departing from the spirit and scope of the invention as defined by the appended claims.

What is claimed is:

1. A non-volatile memory cell formed in a substrate having a semiconductor surface portion of a first conductivity type, comprising:
   a source region and a drain region, each comprising a second conductivity type diffusion at the surface of said substrate having thick oxide thereover;
   a channel region comprising a portion of said substrate underlying a recess therein between said source and drain regions;
   a thin gate insulator overlying said channel region;
   sidewall dielectric covering the sidewalls of said recess;
   a floating gate comprising a dielectrically isolated conductive layer overlying said channel region and extending onto said thick oxide over said source and drain regions; and
   a control gate overlying and capacitively coupled to said floating gate.

2. The cell of claim 1, wherein said source/drain regions comprise metal silicide layers near the respective surfaces thereof.

3. The cell of claim 1, wherein said source and drain regions have a greater thickness of crystalline material above the plane of said gate insulator than below it.

4. The cell of claim 1, wherein said source and drain regions have an effective junction depth (with respect to the surface of said channel region) of less than 5000 Angstroms.

5. The cell of claim 1, wherein said recess has a depth more than half the thickness of said source and drain regions.

6. The cell of claim 1, wherein said floating gate has a minimum thickness more than half the minimum width of said recess.

7. A semiconductor structure comprising:

a pair of spaced apart regions of conductivity-type determining impurity disposed in a face of a semiconductor body, an isolation trench disposed between said regions of impurity and extending into said semiconductor body by less than the depth of said regions of impurity, a layer of insulator material formed over said regions of impurity and covering the walls of said trench, and a layer of conductive material filling said trench, and extending onto the layer of insulator material over said regions of impurity, to form a floating gate.

8. The semiconductor structure of claim 7 and further comprising:

a second layer of insulating material formed over said conductive layer, and a second layer of conductive material formed over said second layer of insulating material.

9. The semiconductor structure of claim 7 wherein said regions of impurity comprise metal silicide layers near the respective surfaces thereof.

10. A semiconductor structure comprising:

a pair of spaced apart regions of conductivity-type determining impurity disposed in a face of a semiconductor body, an isolation trench disposed between said regions of impurity and extending into said semiconductor body, a layer of insulator material formed over said regions of impurity and covering the walls of said trench, the thickness of said layer on the side walls of said trench being greater than the thickness of the thinnest portion of said layer on the bottom wall of said trench, and a layer of conductive material filling said trench, and extending onto the layer of insulator material over said regions of impurity, to form a floating gate.

11. The semiconductor structure of claim 10 wherein at least one of said regions of impurity adjoins a side of said isolation trench.

12. The semiconductor structure of claim 10 and further comprising:

a second layer of insulating material formed over said conductive layer, and a second layer of conductive material formed over said second layer of insulating material.

13. The semiconductor structure of claim 10 wherein said regions of impurity comprise metal silicide layers near the respective surfaces thereof.

* * * * *